United States Patent [19]
Harrigan

[11] Patent Number: 5,629,791
[45] Date of Patent: May 13, 1997

[54] OPTICAL COMPENSATION FOR LASER EMITTER ARRAY NON-LINEARITY

[75] Inventor: Michael E. Harrigan, Webster, N.Y.

[73] Assignee: Eastman Kodak Company, Rochester, N.Y.

[21] Appl. No.: 658,904

[22] Filed: May 31, 1996

[51] Int. Cl.$^6$ .................................................. G02B 26/08
[52] U.S. Cl. .......................... 359/223; 359/833; 359/623
[58] Field of Search ................................. 359/225, 833, 359/623, 223

[56] References Cited

U.S. PATENT DOCUMENTS

| | | | |
|---|---|---|---|
| 4,804,975 | 2/1989 | Yip | 346/76 L |
| 4,826,270 | 5/1989 | Opheij et al. | 369/109 |
| 5,161,064 | 11/1992 | Clark et al. | 359/663 |
| 5,532,884 | 7/1996 | Lee et al. | 359/833 |

*Primary Examiner*—Georgia Y. Epps
*Assistant Examiner*—Thomas Robbins
*Attorney, Agent, or Firm*—Nelson Adrian Blish

[57] ABSTRACT

An optical apparatus, for correcting deviations from straightness of an array of laser emitters in generally aligned positions along an array direction, includes a plurality of mirrors along the light beam paths and positioned to reflect its associated light beam along a folded light beam path. Individual mirrors are selectively displaced along its associated light beam path in a direction so as to align the reflected light beams from all of the plurality of mirrors along the folded light beam path, thereby to correct for any deviation of a laser emitter from the straight, array direction line of the laser emitters. According to a preferred embodiment, a plurality of lenslets having power in at least the array direction are positioned in the light beam paths between the laser emitters and the mirrors such that each lenslet receives the light from an associated laser emitter in the array. A cylinder lens in the light beam paths between the laser emitters and the plurality of lenslets have power in the cross-array direction reduce divergence of the beams in the cross-array direction. The cylinder lens produces a back focal plane of the beams; and a second cylinder lens with power in the cross-array direction collimates the beams after the beams pass through the back focal plane.

13 Claims, 5 Drawing Sheets

FAR FIELD

OPTICAL COMPENSATION FOR LASER EMITTER ARRAY NON-LINEARITY

CROSS REFERENCE TO RELATED APPLICATIONS

Reference is made to commonly assigned, co-pending U.S. patent applications Ser. No. 07/986,207 filed on Dec. 7, 1992; Ser. No. 08/261,370 filed on Jun. 16, 1994, now U.S. Pat. No. 5,521,748; and Ser. No. 08/659,469, entitled OPTICALLY CORRECTING DEVIATIONS FROM STRAIGHTNESS OF LASER EMITTER ARRAYS, and filed by D. Kessler et al. concurrently herewith.

BACKGROUND OF THE INVENTION

1. Technical Field

The present invention relates generally to linear arrays of laser emitters used in printers to expose photosensitive media.

2. Background Art

In laser thermal printers, the optical power of lasers is used to affect the photosensitive media. The printing can take place on dye transfer media, ablation media, photo resist media, or any other photosensitive media. High power is needed to enhance the printing speed of laser thermal printers. One technique for achieving high power in a laser thermal printer is to use a monolithic array of diode laser emitters.

Diode laser emitters arranged in a line can be used in printing applications to create multiple printing spots on an image receiving medium. The laser emitters should be spaced along the line with a pitch sufficiently high to avoid cross talk. Typical pitch values are 0.5 mm to 1 mm. Current manufacturing technology can make such arrays as long as 10 mm.

U.S. Pat. No. 4,804,975, which issued to K. Yip on Feb. 14, 1989, discloses a thermal dye transfer apparatus which includes such a monolithic array of diode laser emitters that illuminate a dye carrying donor medium. The donor medium absorbs the heat from the laser light, and the dye is transferred from the donor medium to the receiving member. The diode laser emitters in the array are independently modulated.

In such an application, it is important to have the printing spots lie on a well defined line. Otherwise, artifacts will be introduced into the document. FIG. 1 shows an array of spots tilted by an angle α on a medium wrapped around a drum. Raster lines 10, 12, 14, and 16 are formed from the spots. Spots 18 and 20 are on an acceptable line, while spot 22 is displaced from its desired position.

In this case the array of printing spots is tilted by angle α to provide raster lines 10, 12, 14, etc. with a predetermined pitch. The deviation of printing spot 22 from a straight line results in an axial displacement of its raster line along the printing drum. This uneven spacing of the raster lines is a source of printing artifacts such as the one called "banding." If the printing head is not tilted such that α=0, the deviations from straightness can be cured electronically for a particular writing plane by using different time delays for each of the printing spots. However, when the medium surface is shifted from this particular plane (such as by the use of a receiver sheet of different thickness), the delays may need to be adjusted, or the position errors will be evident. It is thus important in multi-spot laser printers to have the printing spots lie on a straight line and to preserve this straightness over a certain depth of focus along the optical axis.

Typically, the printing spots are created by an optical system which makes a magnified image of the laser emitters. A normal laser diode emitter in the array has an aperture of approximately 4 microns to 200 microns in the array direction by 0.5 micron to 1 micron in the cross-array direction. The "array" direction refers to the direction along the line of laser emitters, and the "cross-array" direction refers to the direction perpendicular to the line of laser emitters. Printing spots ordinarily may lie in a range from about 5 microns to about 50 microns in size: so the optical system will need to produce a magnification from 10× to 100×.

Some laser manufacturing processes result in laser emitters having displacements from a perfect line. The magnitude of these errors can easily be 5 microns, which is much larger than the spot itself. With the optical system magnifying the spots by such a large amount in the cross-array direction as described above, the displacement error is also magnified by the same amount. This causes a large displacement of the printing spots compared to the actual spot dimension. Printing with such a non-straight line of spots will not produce acceptable images. The perpendicular deviations of the laser emitters from an ideal line are referred to herein as "cross-array emitter position" errors.

In the far field (far away from the emitter), the beams will spread and become large as shown in FIG. 2. Any emitter deviations from straightness of several microns in the cross-array direction become small compared to the beam size, and one can say that, in the far field, the beams lie on a substantially straight line because the cross-array emitter position errors are small compared the beam sizes.

The far field can be brought to a finite distance with the use of a lens with power in the cross-array direction. FIG. 3 shows a section of a laser diode array in the cross-array direction. Laser emitters 24 and 26 are displaced due to cross-array emitter position error. A lens 28 is placed at a distance of $f_{28}$ from the emitter. The far field is found at the back focal plane (the second principal focus) 30 of lens 28. At the back focal plane, the array is therefore straight. However the beams from the different laser emitters emerge from this plane at different angles. The cross-array emitter position errors are transformed into angular errors. If the cross-array emitter position error for say emitter 24 is ε, then the angular error at plane 30 is given simply by $\epsilon/f_{28}$.

Another way to describe the straightening of the array at the back focal plane of the lens 28 is to note that the rays at the center of the beams from the different laser emitters of the array all start perpendicular to the emitting surface so they are all parallel to each other. It is well known that parallel rays entering a lens will intersect at the back focal plane of the lens; thus the emitter array is straightened at this plane because the center rays of the laser emitters intersect there. The back focal plane can then be imaged by other optics onto the media with the printing spots forming a straight line.

One can achieve a straight line of printing spots if the back focal plane of lens 28 is directly imaged to the medium. Referring to FIG. 2, in the far field, as one moves far away from the laser, the beam diverges and becomes large. The emitter deviations from straightness (of about a couple of microns in the cross array direction) become negligible, and one can say that, in the far field, the array is "straight." This assumes that one emitter can be distinguished from the other at this large distance, such as by providing optics, such as for example a lenslet array with power in the array direction, to prevent the light from the different laser emitters on the array from mixing in the array direction.

Commonly assigned, co-pending U.S. patent application Ser. No. 07/986,207, filed Dec. 7, 1992, discloses a monolithic array where each of the diode laser emitters in the array is independently modulated, and lenslets are used to closely pack the printing spots at the media. In this application, the cross-array emitter position errors are corrected by imaging the far field of the laser emitters onto the media in the cross-array direction.

Commonly assigned, co-pending U.S. patent application Ser. No. 08/261,370 entitled "Multi spot digital printer using laser and laser array" filed on Jun. 16, 1994 now U.S. Pat. No. 5,521,748, discloses the use of diode laser arrays to illuminate an array of spatial modulators, which are then imaged onto the receiver medium to produce an array of printing spots. In a printer of this kind, it is common to mix the light from the laser emitters in the bar so as to provide improved illumination uniformity at the modulator and to protect against a defective or a dead emitter in the array affecting the print. To avoid light losses at the spatial modulators, one should have a straight magnified emitter image at the modulators. This can be accomplished with the method disclosed in aforementioned application Ser. No. 07/986,207 by making the modulator geometrically conjugate to the far field of the laser emitters in the cross-array direction of the beam.

In applications requiring high power throughput such as a thermal dye transfer process as disclosed in application Ser. No. 07/986,207, it is not sufficient to have a straight line of printing spots at an image receiver medium. While the back focal plane imaging technique shown in FIG. 3 produces a straight line of spots, it does not completely compensate for cross-array emitter position errors. As can be seen from FIG. 3, the cross-array emitter position errors are converted into angular errors of the beams after back focal plane 30. These angular errors may be further increased as the light progresses down the optical system. If the angular errors become too large, light loss may result, and the power throughput reduced by an unacceptable amount.

This light loss is more apparent in the system using modulators disclosed U.S. Pat. No. 5,521,748. In this system, the back focal plane of the first lens is imaged onto a modulator, which can be envisioned as an array of apertures. When such a back focal plane is imaged onto a modulator with a reduced magnification, the angular errors of the beams at the modulator are magnified. This fact must be so to preserve the Langrange Invariant. Magnified angular errors place a larger burden on the following lens numerical aperture, which must be enough to accept these magnified angles. Otherwise the optical system after such a modulator will vignette light from laser emitters which have large cross-array emitter position errors.

Even if the light beams pass through a post modulator optical system unvignetted, the depth of focus at an image receiving medium will be smaller than that achieved with no cross-array emitter position errors. The focal depth is reduced because, when large beam angles enter an image receiving medium, the increased spreading of the light causes printing spots to grow to an unacceptable size with a smaller focal shift.

Hence, un-corrected cross-array emitter position errors have at least the following three adverse effects: (1) a non-straight line of printing spots, (2) light losses by vignetting of the beams, and (3) reduced focal depth at the printing medium making the system more difficult to manufacture. Thus, the prior art does not provide means for fully correcting the non straightness of the diode laser array.

DISCLOSURE OF THE INVENTION

It is an object of the present invention to remove or greatly reduce large cross-array emitter position errors and angular errors.

It is another object of the present invention to remove or greatly reduce cross-array emitter position errors and angular errors for beams by means of a component that may be adjusted to remove the cross-array emitter position error of each emitter in the array without affecting other laser emitters.

According to a feature of the present invention, a plurality of mirrors in an array are used to straighten beams emitted by laser emitters not lying on a straight line. Each reflector in the mirror array is associated with a single laser emitter and is displaced according to the non-linearity error of the emitter.

According to another feature of the present invention, an optical apparatus, for correcting deviations from straightness of an array of laser emitters in generally aligned positions along an array direction, includes a plurality of mirrors along the light beam paths and positioned to reflect its associated light beam along a folded light beam path. Individual mirrors are selectively displaced along its associated light beam path in a direction so as to align the reflected light beams from all of the plurality of mirrors along the folded light beam path, thereby to correct for any deviation of a laser emitter from the straight, array direction line of the laser emitters.

According to a preferred embodiment of the present invention, a plurality of lenslets having power in at least the array direction are positioned in the light beam paths between the laser emitters and the mirrors such that each lenslet receives the light from an associated laser emitter in the array. A cylinder lens in the light beam paths between the laser emitters and the plurality of lenslets have power in the cross-array direction reduce divergence of the beams in the cross-array direction. The cylinder lens produces a back focal plane of the beams; and a second cylinder lens with power in the cross-array direction collimates the beams after the beams pass through the back focal plane.

The invention, and its objects and advantages, will become more apparent in the detailed description of the preferred embodiments presented below.

BRIEF DESCRIPTION OF THE DRAWINGS

In the detailed description of the preferred embodiments of the invention presented below, reference is made to the accompanying drawings, in which.

BEST MODE FOR CARRYING OUT THE INVENTION

The present description will be directed in particular to elements forming part of, or cooperating more directly with, apparatus in accordance with the present invention. It is to be understood that elements not specifically shown or described may take various forms well known to those skilled in the art.

Figure 4:
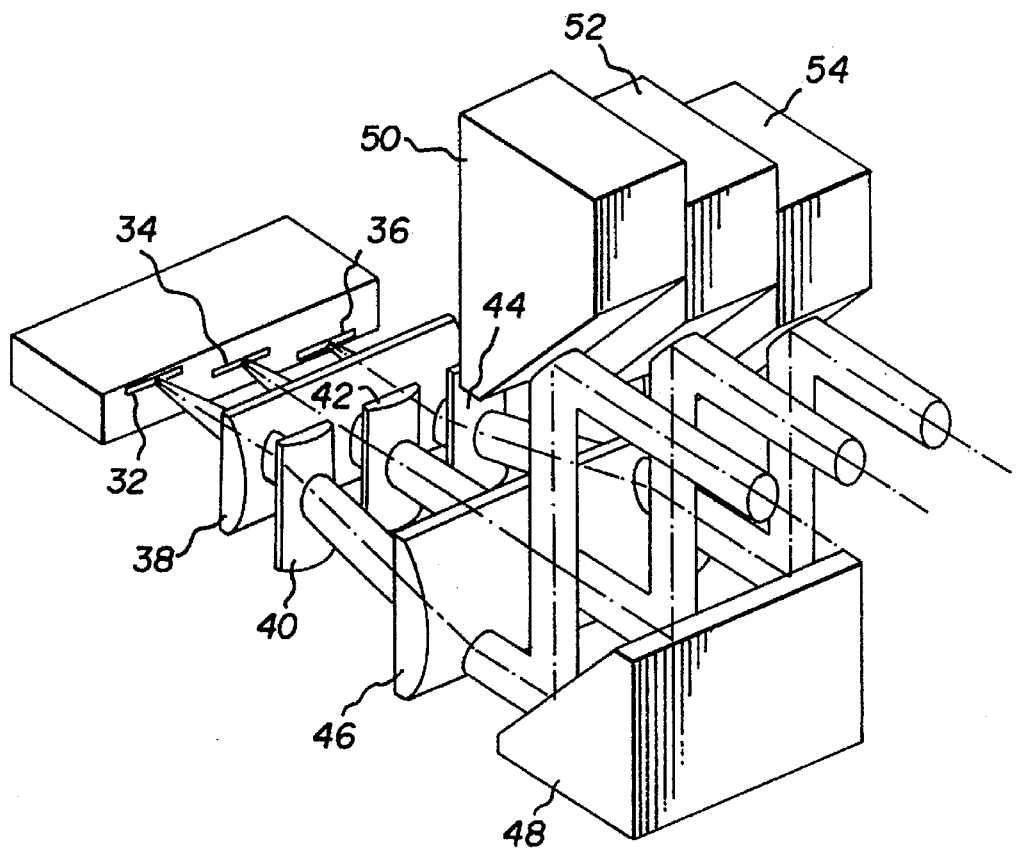
FIG. 4 is a perspective view of a laser emitter and imaging system according to the present invention.

FIG. 4 shows a preferred embodiment of the present invention. Laser emitters 32, 34, and 36 are shown with emitter 34 having no cross-array emitter position error, 32 having a positive cross-array emitter position error (displacement is upward), and 36 having a negative cross-array emitter position error (displacement is downward).

A cylinder lens 38 has power only in the cross-array direction. Lenses 40, 42, and 44 form an array of lenses in the array direction with a pitch the same as the laser emitters. Lenses 40, 42, and 44 collimate the light emitted along the array of emitters. Cylinder lens 38 need not collimate the light emitted perpendicular to the line of emitters, although it usually is needed to at least reduce the more highly divergent cross-array light of the laser emitters.

Another cylinder lens 46 with power in the cross-array direction is positioned so that it collimates the light from the back focal plane of lens 38. Following lens 46 is first mirror 48 tilted at 45°. Mirror 48 deflects the beams vertically to individual mirrors 50, 52, and 54. Each of the mirrors 50, 52, and 54 is associated with a laser emitter and is adjusted along the path of light that has been deflected by mirror 48 so that, after deflection, the beams are all at the same vertical height. The mirrors take out the cross-array emitter position errors.

Figure 5:
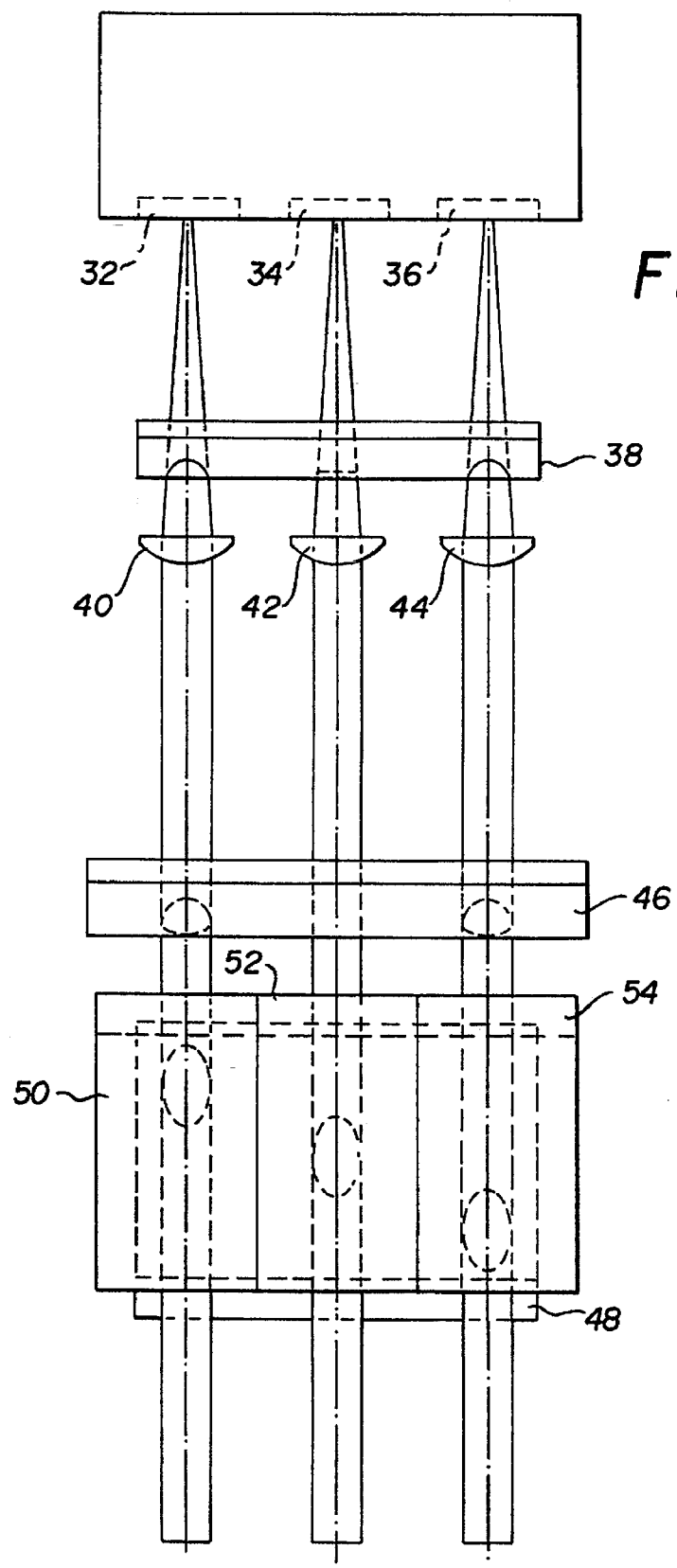
FIG. 5 is a top plan view of the laser emitter and imaging system of FIG. 4.
Figure 6:
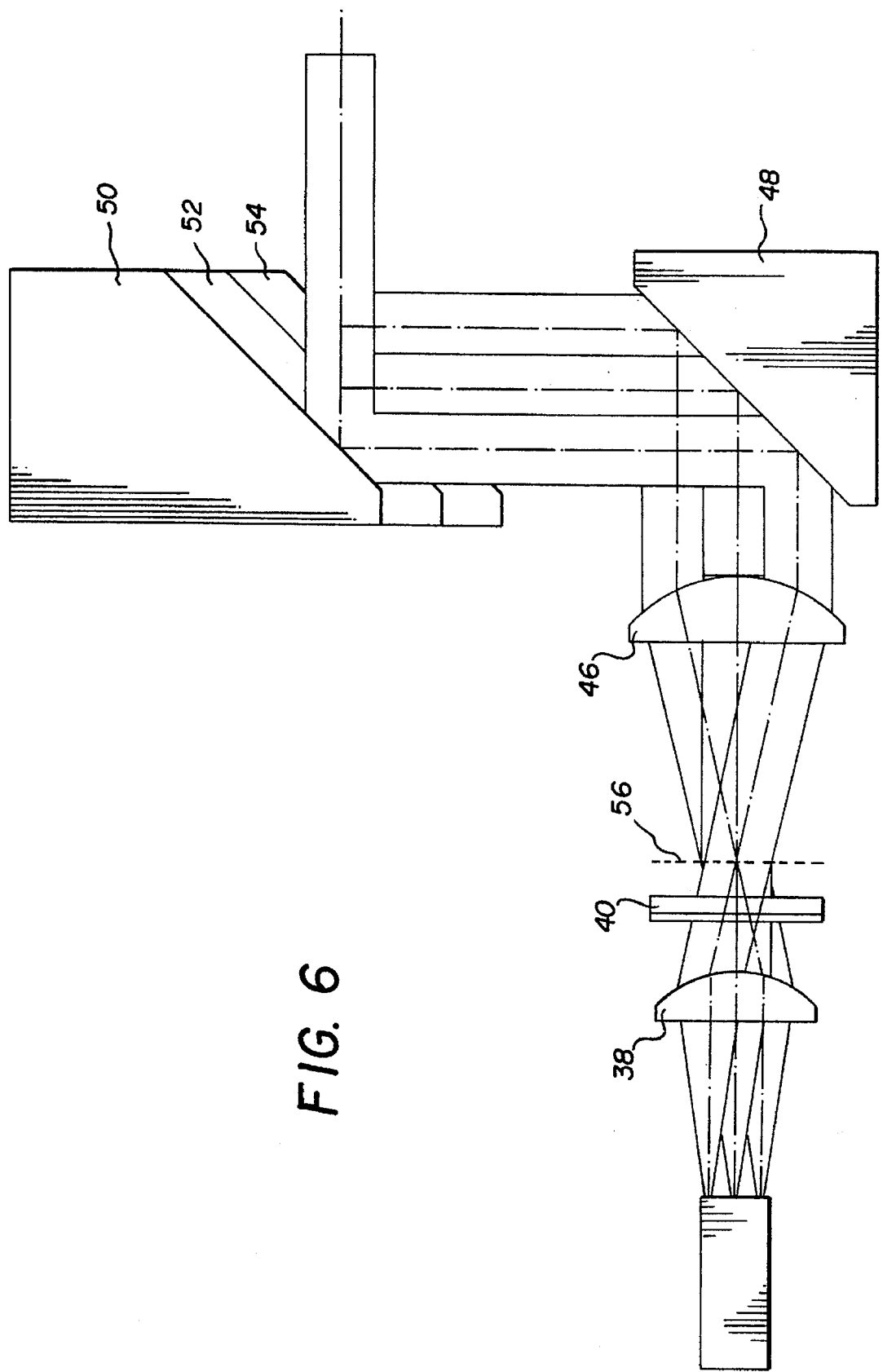
FIG. 6 is a side elevational view of the laser emitter and imaging system of FIGS. 4 and 5.

It is preferred to collimate the beams in the array direction to minimize beam overlap so that mirrors 50, 52, and 54 can be adjusted for each emitter without affecting the light from other emitters. FIG. 5 is a view from the top of the device showing in particular the collimated beams exiting the array of lenses 40, 42, and 44. FIG. 6 is a side view showing where the emitter chief rays (dashed lines) are focused at plane 56 by cylinder lens 38. The same chief rays are shown to be parallel after lens 46 and at the same height after the array of mirror 50, 52, and 54.

After lens 46, the beam of each emitter is at a height determined by its cross-array emitter position error. The center ray, or chief ray, of each emitter focuses at the back focal plane of lens 38 and these rays exit lens 46 parallel to themselves. Mirrors 48, 50, 52, and 56 take out the height difference between the beams which is a measure of the cross-array emitter position error. In fact, lens assembly 38 and 46 form an afocal system whose magnification is $F_4/F_2$, where $F_4$ is the focal length of lens 46 and $F_2$ is the focal length of lens 38.

The magnification of the afocal assembly consisting of lens 38 and lens 46 gets larger when $F_2$ decreases and $F_4$ increases, causing a larger displacement of the beams after lens 46.

It is usually desirable to have lens 38 close to the emitter to better gather the highly diverging light while having lens 46 as far away as possible to enable a conventional lens to be used. If the focal length of lens 46 is as short as 1 mm or 2 mm, it may be difficult to obtain a conventionally made lens or it may be necessary to have additional lenses whose overall focal length when combined is sufficiently short. This is a significant advantage of this invention, namely, permitting the correction of large displacements when $F_4$ is large enough to be made conventionally.

It should be noted that it is necessary for the assembly consisting of lens 46 and mirrors 50, 52, 54, and 56 to be close to array lenses 40, 42, abd 44 to in insure a minimum of overlap between the beams of each laser emitter when they deflect off their respective mirrors. Too large a distance would limit the effectiveness the invention. This means that the focal length of lens 46 should not be so large as to cause excessive beam overlap for the light along the array.

Figure 1:
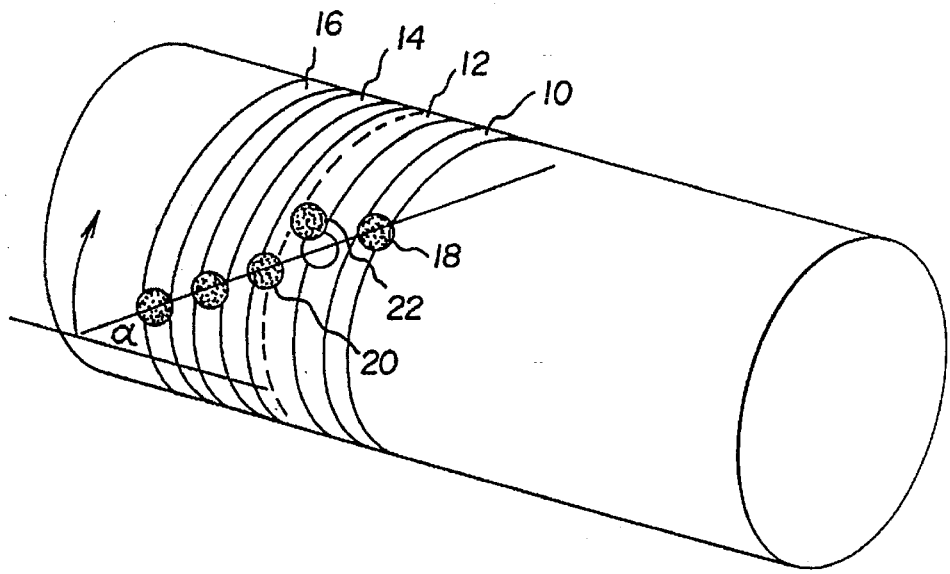
FIG. 1 is a view of a printing drum imaged by a laser emitter array according to the prior art.
Figure 2:
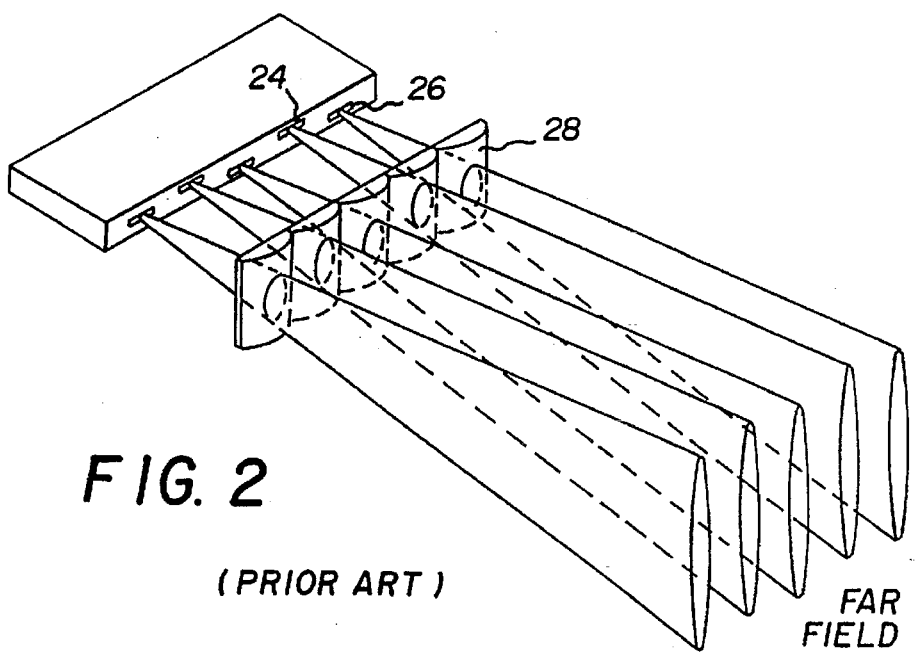
FIG. 2 is a perspective view of a laser emitter and imaging system according to the prior art.
Figure 3:
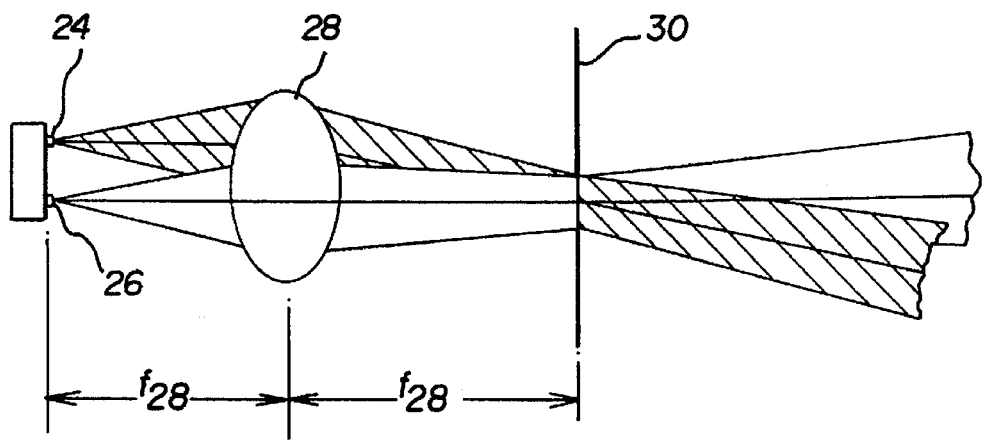
FIG. 3 is a side sectional view of another laser emitter and imaging system according to the prior art.

This preferred embodiment works in a space where the emitter chief rays are parallel, but it also possible to correct cross-array emitter position errors in a space where the chief rays are not parallel with the method of the second embodiment. Emitter chief rays are shown in FIG. 3 as the heavy lines starting at 24 and 26 in the center of the shaded light bundles. These chief rays pass through the center of the back focal plane 30 of lens 28 and the cross-array emitter position positional errors at the emitter are converted into pure angular errors at plane 30.

Figure 7:
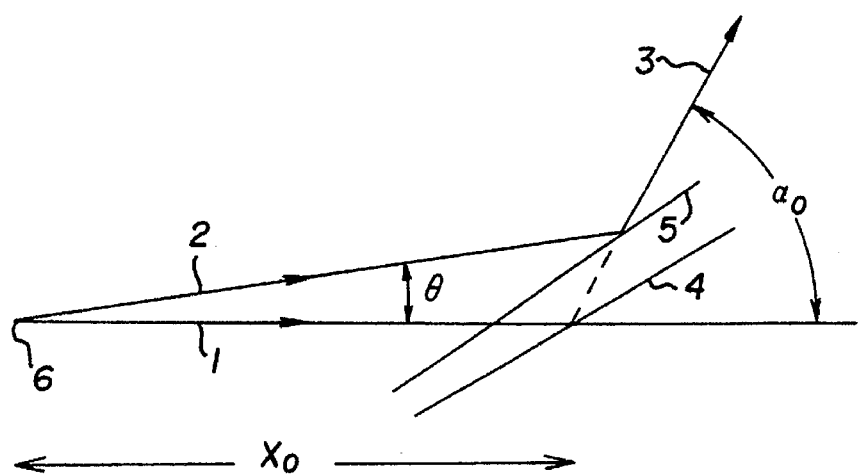
FIG. 7 is a schematic illustration of a method using rotating and displacing mirrors.

One can show mathematically that, in order to completely correct cross-array emitter position errors in the space immediately after such a place as plane 30 of FIG. 3 with a reflector, the reflector must not only tilt, but shift position. The proof follows with reference to FIG. 7 which shows rays 1 and 2 diverging from a point 6 such as plane 30. Ray 1 is the reference ray which has no cross-array emitter position error and is reflected upward from a mirror 4 as ray 3 at an angle $\alpha_o$. Mirror 4 is located at a distance $x_o$ from the point where ray 1 and ray 2 diverge. Ray 2 is a ray with cross-array emitter position error causing it to have an angle $\theta$ with respect to ray 1. If mirror 4 is rotated and shifted to position 5, it will deflect ray 2 along ray 3 and remove the cross-array emitter position error. The mirror is positioned so that its surface intersects the same point where ray 2 and ray 3 intersect. The mirror angle must be set to bisect the angle between $\alpha_o$ and $\theta$ to insure that it goes along ray 3.

For reference, let the origin of a Cartesian coordinate system be located at point 6 with its X-direction along ray 1 and its Y-direction vertical along a ray which would have an angle $\theta=90$ degrees. Let the point of intersection of an incoming ray and outgoing ray be designated by $(x_i,y_i)$. Then the following equations can be written.

$$\text{Incoming ray line: } y=x \tan \theta \quad (1)$$

$$\text{Outgoing ray line: } y=(x-x_o) \tan \alpha_o \quad (2)$$

$$\text{mirror line: } y=x_i \tan \theta+(x-x_i) \tan \tfrac{1}{2}(\theta+\alpha_o) \quad (3)$$

The intersection coordinates of the incoming and outgoing rays can be shown to be given by:

$$x_i = \frac{x_o \tan \alpha_o}{\tan \alpha_o - \tan \theta} \quad y_i = x_i \tan \theta$$

If it were possible to exactly correct the cross-array emitter position error by simply rotating the mirror about a point, then it would be possible to find such an intersection point using the mirror line equation 3. If one takes a mirror line for $\theta=0$ and a mirror line for non-zero $\theta$ to find such an intersection $(x_1,y_1)$, then the following two equations must be solved simultaneously:

$$y_1=x_i \tan \theta+(x_1-x_i) \tan \tfrac{1}{2}(\theta+\alpha_o) \quad (4)$$

$$y_1=(x_1-x_o) \tan \tfrac{1}{2}\alpha_o \quad (5)$$

After eliminating $Y_1$ between these equations, applying many trigonometric identities and algebra, it can be shown that:

$$x_1 = \frac{x_o \sin\alpha_o \sin\theta}{4\cos\frac{1}{2}\alpha_o \cos\frac{1}{2}\theta \cos\frac{1}{2}(\alpha_o - \theta)} \quad (6)$$

As can be seen from this equation, the x coordinate of the mirror intersection point depends on the incoming ray angle θ, so this means that the intersection point must move for each value of θ.

If the range of cross-array emitter position angular errors is not too large, it can be seen that $x_1$ is nearly zero because θ is small, and then from equation 5 for $x_1$ equal to zero:

$$y_1 = -x_o \tan \tfrac{1}{2}\alpha_o$$

This implies that for small θ, the mirror does rotate approximately about the same point because $y_1$ as given above is independent of θ.

Now, it is possible to rotate the mirror about a point so that all the outgoing rays are parallel, but they will not lie on top of each other. In other words, the cross-array emitter position error will not be completely nullified. One can inquire about the residual cross-array emitter position error and see if is acceptably small for a restricted range of θ.

Figure 8:
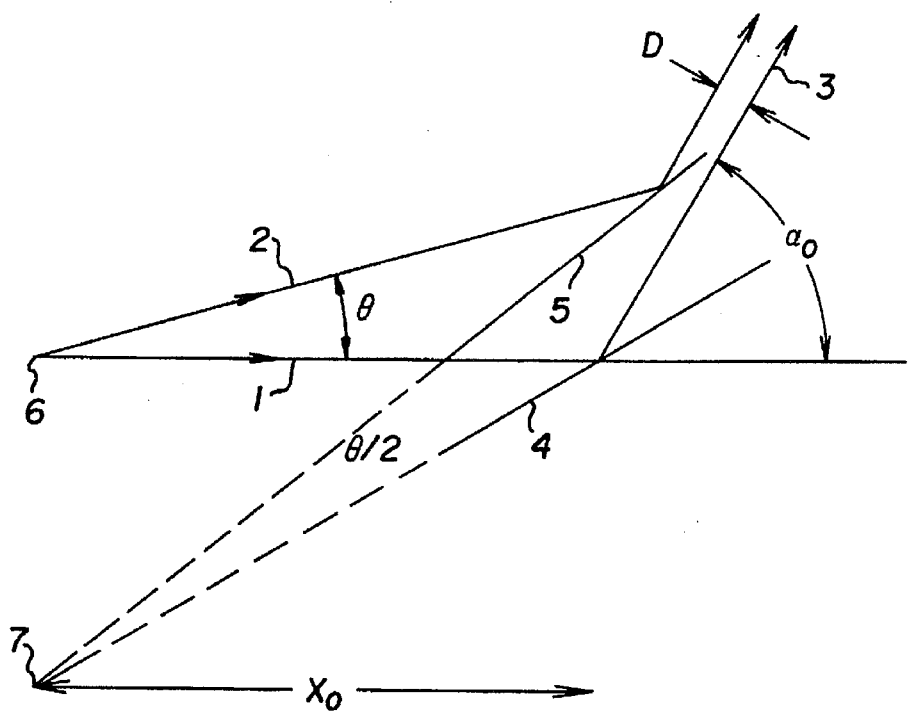
FIG. 8 is a schematic illustration of a method using mirror rotation about a point.

In FIG. 8, a mirror 4 rotates about a position is at $(0, -x_o \tan \tfrac{1}{2}\alpha_o)$ as found above. Rays 1 and 2 are as in FIG. 7, diverging from point 6. Ray 1 is the reference ray with zero cross-array emitter position error, while ray 2 has an angular cross-array emitter position error given by θ. Ray 2 reflects off mirror 5 which is simply mirror 4 rotated by θ/2 about point 7. Ray 2 deflects at an angle $\alpha_o$ parallel to ray 3 which is ray 1 after reflecting off mirror 4. But ray 2 is does not have its cross-array emitter position error completely removed because it is a distance D from ray 3. The object is to find the functional dependence of D on angle θ.

D is the perpendicular distance from ray 3 to the intersection of ray 2 and mirror 5. First find the coordinates of the intersection of ray 2 and mirror $5 = (x_i, y_i)$. The mirror 5 line is:

$$y = x \tan \tfrac{1}{2}(\alpha_o + \theta) - x_o \tan \tfrac{1}{2}\alpha_o \quad (7)$$

The input ray 2 line is:

$$y = x \tan \theta \quad (8)$$

Solving 7 and 8 for the intersection, the following is found:

$$x_i = \frac{x_o \tan\frac{1}{2}\alpha_o}{\tan\frac{1}{2}(\alpha_o + \theta) - \tan\theta}$$

$$y_i = \frac{x_o \tan\frac{1}{2}\alpha_o \tan\theta}{\tan\frac{1}{2}(\alpha_o + \theta) - \tan\theta}$$

The output ray line reflected off mirror 5 is:

$$y = y_i + (x - x_i) \tan \alpha_o \quad (9)$$

A line perpendicular to this ray passing through the intersection point $(x_i, y_i)$ is:

$$y = y_i - \frac{(x - x_i)}{\tan\alpha_o} \quad (10)$$

The ray 3 line is:

$$y = (x - x_o) \tan \alpha_o \quad (11)$$

Let the intersection of line 10 and 11 be given by $(x_2, y_2)$, then:

$$D^2 = (x_2 - x_i)^2 + (y_2 - y_i)^2 \quad (12)$$

Working out the intersection of 10 and 11 it is found:

$$x_2 = y_i \sin\alpha_o \cos\alpha_o + x_i \cos^2\alpha_o + x_o \sin^2\alpha_o$$

$$y_2 = y_i \sin^2\alpha_o + (x_i - x_o) \sin\alpha_o \cos\alpha_o$$

It can also be found that:

$$x_2 - x_i = y_i \sin\alpha_o \cos\alpha_{o+}(x_o - x_i) \sin^2\alpha_o$$

$$y_2 - y_i = -\cos\alpha_o$$

The following result can be found for D:

$$D = \frac{x_o \left[ \tan\frac{1}{2}\alpha_o \tan\theta \cos\alpha_o + \sin\alpha_o \left( \tan\frac{1}{2}(\alpha_o + \theta) - \tan\theta - \tan\frac{1}{2}\alpha_o \right) \right]}{\tan\frac{1}{2}(\alpha_o + \theta) - \tan\theta}$$

It can also be shown through much tedious algebra that as θ→0:

$$D \to \tfrac{1}{2} x_o \theta^2 \tan \tfrac{1}{2}\alpha_o$$

The importance of this is that the residual height error is proportional to the small angle squared, so D is small enough to be acceptable as long as $x_o$ is not very large. As an example, if $\alpha_o$ is 60°, θ is 3°, and $x_o$ is 10, then D is 0.007907. In many cases, this residual height error is sufficiently small that the cross-array emitter position error is substantially corrected.

Advantages of the Invention

The current invention provides full correction of the cross-array emitter placement errors of laser emitters of a laser bar so that the performance of a printing head will be essentially equivalent to the performance achieved with a perfectly straight emitter array. This correction goes beyond methods which only provide a straight array only at one plane. The presently disclosed invention will greatly reduce light losses and provide maximum depth of focus. The present invention is not limited in the practical amount of displacement which can be corrected, nor does it suffer from the defects introduced by tilting or displaced lenses.

The present invention applies to both a laser bar as disclosed in application Ser. No. 07/986,207 and to bars used with modulators as in U.S. Pat. No. 5,521,748. Also the invention is applicable in other uses of laser bars where it is important to reduce the Lagrange Invariant or the Entendue or equivalently to increase the brightness of the usable light from laser bars in such cases as coupling laser light from bars to fibers such as where the laser bars are used as pumping sources for other laser emitters.

The invention has been described in detail with particular reference to preferred embodiments thereof, but it will be understood that variations and modifications can be effected within the spirit and scope of the invention.

What is claimed is:

1. An optical apparatus for correcting deviations from straightness of an array of laser emitters, said apparatus comprising:

an array of laser emitters in generally aligned positions along an array direction, the positions of the emitters deviating from a straight, array direction line in a cross-array direction perpendicular to the array direction, each laser emitter producing a beam of light in a direction normal to the array and the cross-array directions such that the light beams travel along individual light beam paths;

a plurality of mirrors along the light beam paths, at least one of the plurality of mirrors being associated with each light beam, and positioned to reflect its associated light beam along a folded light beam path; and means for selectively displacing individual ones of the plurality of mirrors along its associated light beam path in a direction so as to align the reflected light beams from all of the plurality of mirrors along the folded light beam path, thereby to correct for any deviation of a laser emitter from the straight, array direction line of the laser emitters.

2. An optical apparatus as set forth in claim 1 further comprising a plurality of lenslets in the light beam paths between the laser emitters and the mirrors such that each lenslet receives the light from an associated laser emitter in the array, said lenslets having power in at least the array direction.

3. An optical apparatus as set forth in claim 2 further comprising a cylinder lens in the light beam paths with power in the cross-array direction to reduce divergence of the beams in the cross-array direction.

4. An optical apparatus as set forth in claim 3 wherein the cylinder lens is positioned in the light beam paths between the laser emitters and the mirrors.

5. An optical apparatus as set forth in claim 4 wherein the cylinder lens is positioned in the light beam paths between the laser emitters and the plurality of lenslets.

6. An optical apparatus as set forth in claim 2 further comprising:

a cylinder lens in the light beam paths with power in the cross-array direction to reduce divergence of the beams in the cross-array direction so as to produce a back focal plane of the beams; and a second cylinder lens with power in the cross-array direction which collimates chief rays of the beams after the beams pass through the back focal plane.

7. An optical apparatus as set forth in claim 6 wherein both of the cylinder lenses are positioned in the light beam paths between the laser emitters and the mirrors.

8. An optical apparatus as set forth in claim 7 wherein:

one cylinder lens is positioned in the light beam paths between the laser emitters; and the plurality of lenslets and the other cylinder lens is positioned in the light beam paths between the lenslets and the mirrors.

9. An optical apparatus as set forth in claim 8 wherein the second cylinder lens is positioned in the light beam paths between the lenslets and the mirrors.

10. An optical apparatus as set forth in claim 1 further comprising means for folding the light beam paths between the laser emitters and the mirrors.

11. An optical apparatus as set forth in claim 10 wherein both of the means for folding the light beam paths and the mirrors are adapted to fold the light beam paths at approximately 45°.

12. An optical apparatus as set forth in claim 1 wherein the mirrors are displaced along the optical path a distance $X_1$ according to the equation $$x_1 = \frac{x_o \sin\alpha_o \sin\theta}{4\cos\frac{1}{2}\alpha_o \cos\frac{1}{2}\theta \cos\frac{1}{2}(\alpha_o - \theta)}$$

wherein $\alpha_o$ is an angle of reflection of a beam from the light beam path of an emitter which has no cross-array position error, $x_o$ is a distance between a mirror and a point of divergence of the light beams, and $\theta$ is an angle between a beam from an emitter with cross-array position error and a beam from an emitter without cross-array emitter error.

13. An optical apparatus as set forth in claim 3 wherein the mirrors tilt about a point:

located along the optical path at a position substantially the same as where chief rays cross the optical path after the cross-array cylinder lens; and displaced from the optical path by a distance $$y_1 = -x_o \tan \tfrac{1}{2}\alpha_o.$$

* * * * *